US010224283B2

(12) United States Patent
Canaperi et al.

(10) Patent No.: US 10,224,283 B2
(45) Date of Patent: Mar. 5, 2019

(54) COMPOSITE MANGANESE NITRIDE / LOW-K DIELECTRIC CAP

(71) Applicant: International Business Machines Corporation, Armonk, NY (US)

(72) Inventors: Donald F. Canaperi, Bridgewater, CT (US); Son V. Nguyen, Schenectady, NY (US); Takeshi Nogami, Schenectady, NY (US); Deepika Priyadarshini, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/645,668

(22) Filed: Jul. 10, 2017

(65) Prior Publication Data
US 2017/0317032 A1 Nov. 2, 2017

Related U.S. Application Data

(62) Division of application No. 14/975,729, filed on Dec. 19, 2015, now Pat. No. 9,711,456.

(51) Int. Cl.
H01L 21/4763 (2006.01)
H01L 23/532 (2006.01)
H01L 21/768 (2006.01)

(52) U.S. Cl.
CPC .. *H01L 23/53238* (2013.01); *H01L 21/76832* (2013.01); *H01L 21/76834* (2013.01); *H01L 21/76849* (2013.01); *H01L 21/76855* (2013.01)

(58) Field of Classification Search
None
See application file for complete search history.

(56) References Cited

U.S. PATENT DOCUMENTS 6,329,284 B2 * 12/2001 Maekawa ......... H01L 21/76882
257/E21.588
6,623,755 B2 9/2003 Chen et al.
8,299,365 B2 10/2012 Nguyen et al.
(Continued)

FOREIGN PATENT DOCUMENTS

AU 2010310750 A1 6/2012
JP 2011-171559 A 9/2011
(Continued)

OTHER PUBLICATIONS

List of IBM Patents or Patent Applications Treated as Related Dated Jul. 10, 2017, 2 Pages.

*Primary Examiner* — Hung Vu
(74) *Attorney, Agent, or Firm* — Scully, Scott, Murphy & Presser, P.C.; Daniel P. Morris, Esq.

(57) ABSTRACT

A semiconductor device includes a metal-containing structure such as a copper-containing wire or plug and a composite capping layer formed over the metal-containing structure. The composite capping layer includes a manganese-containing layer disposed over the metal-containing structure, a silicon-containing low-k dielectric layer disposed over the manganese-containing layer, and an intermediate layer between the manganese-containing layer and the silicon-containing low-k dielectric layer. The intermediate layer is the reaction product of the manganese-containing layer and the silicon-containing low-k dielectric layer.

20 Claims, 3 Drawing Sheets

(56) References Cited

U.S. PATENT DOCUMENTS

| | | |
|---|---|---|
| 8,431,436 B1 | 4/2013 | Nguyen |
| 9,048,294 B2 | 6/2015 | Tang et al. |
| 9,054,109 B2 | 6/2015 | Lin et al. |
| 9,076,661 B2 | 7/2015 | Ma et al. |
| 9,305,836 B1 | 4/2016 | Gates et al. |
| 2012/0061838 A1* | 3/2012 | Edelstein .......... H01L 21/76832 257/751 |
| 2013/0307150 A1 | 11/2013 | Edelstein et al. |
| 2014/0220772 A1 | 8/2014 | Lakshmanan et al. |
| 2015/0108646 A1 | 4/2015 | Chae et al. |
| 2015/0108647 A1 | 4/2015 | Zhang et al. |
| 2015/0137373 A1 | 5/2015 | Zhang et al. |
| 2015/0214157 A1 | 7/2015 | Canaperi |

FOREIGN PATENT DOCUMENTS

| | | |
|---|---|---|
| WO | 2011050073 A1 | 4/2011 |
| WO | 2013/155436 A1 | 10/2013 |
| WO | 2014/194199 A1 | 12/2014 |

\* cited by examiner

COMPOSITE MANGANESE NITRIDE / LOW-K DIELECTRIC CAP

BACKGROUND

The present application relates generally to interconnect structures, and more specifically to barrier layers for advanced interconnects and their methods of production.

As technology nodes advance in semiconductor devices, resistor-capacitor (RC) delay is a major factor in determining the performance of ultra large scale integrated (ULSI) circuits. The use of copper in integrated circuits reduces line resistance, but an efficient barrier layer is needed to prevent unwanted copper diffusion and oxygen/moisture penetration. Further, in order to improve the switching performance of future circuit designs, low dielectric constant insulators are needed.

SUMMARY

In accordance with embodiments of the present application, a semiconductor device includes a metal-containing structure such as a copper-containing wire or plug and a composite capping layer formed over the metal-containing structure. The composite capping layer includes a manganese-containing layer disposed over the metal-containing structure, a silicon-containing low-k dielectric layer disposed over the manganese-containing layer, and an intermediate layer between the manganese-containing layer and the silicon-containing low-k dielectric layer. The intermediate layer is formed in situ as the reaction product of the manganese-containing layer and the silicon-containing low-k dielectric layer. The manganese-containing layer may comprise manganese metal or manganese nitride.

A method of forming a composite capping layer over a metal-containing structure includes forming a manganese-containing layer over a metal-containing structure and then forming a silicon-containing low-k dielectric layer over the manganese-containing layer. During or subsequent to forming the silicon-containing low-k dielectric layer, the manganese-containing layer and the silicon-containing low-k dielectric layer react to form an intermediate layer between the manganese-containing layer and the silicon-containing low-k dielectric layer. The composite capping layer is an effective diffusion barrier to copper, as well as oxygen and moisture, and may function also as an etch stop layer or chemical mechanical polishing stop layer.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
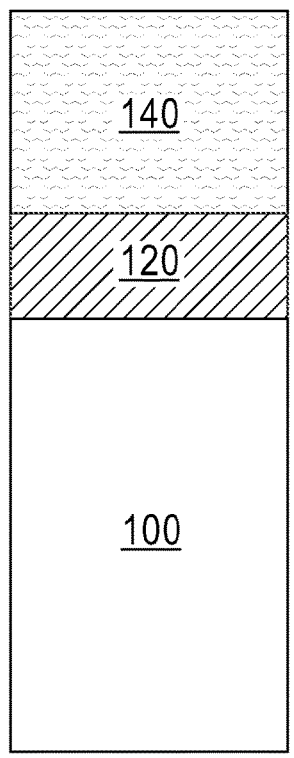
FIG. 1 shows an intermediate step in the fabrication of a composite capping layer where a manganese-containing layer is disposed over a metal-containing structure and a silicon-containing low-k dielectric layer is disposed over the manganese-containing layer.

Reference will now be made in greater detail to various embodiments of the subject matter of the present application, some embodiments of which are illustrated in the accompanying drawings. The same reference numerals will be used throughout the drawings to refer to the same or similar parts.

Copper metal (Cu) and copper metal alloys are effective materials for use in interconnect structures, but typically a barrier layer is needed to inhibit the unwanted diffusion of copper into adjacent materials and structures. As used herein, the term "interconnect" refers to a conductive structure adapted to transmit an electrical signal, e.g., electrical current, from a first location within a device to at least a second location. An interconnect may provide electrical communication in a vertical direction, i.e., orthogonal to a substrate surface. In this manner, the interconnect may be disposed as a plug filling a via. The interconnect may also provide for electrical communication in a horizontal direction, i.e., parallel to a substrate surface. In this manner, the interconnect may be a metal line and/or metal wiring.

Disclosed are thin, multilayer architectures comprising a self-aligned diffusion barrier that provides optimal performance among individual layers, improved moisture barrier properties, and an overall enhanced resistance to copper diffusion, corrosion and oxidation. The disclosed interconnect structures include a composite capping layer that is compatible with the design criteria of advanced technology nodes. In addition to its barrier properties, in various embodiments the composite capping layer may function as an etch stop or chemical mechanical polishing (CMP) stopping layer.

In embodiments, the interconnect structure comprises a layer of a silicon-containing low-k dielectric material, a layer of manganese metal or manganese nitride, and an intervening layer formed as a reaction product of the silicon-containing low-k dielectric material and the manganese metal or manganese nitride. The manganese metal or manganese nitride may be formed directly over or proximate to an interconnect structure such as a copper-containing structure, while the silicon-containing low-k dielectric material is formed over the manganese metal or manganese nitride layer.

Figure 2:
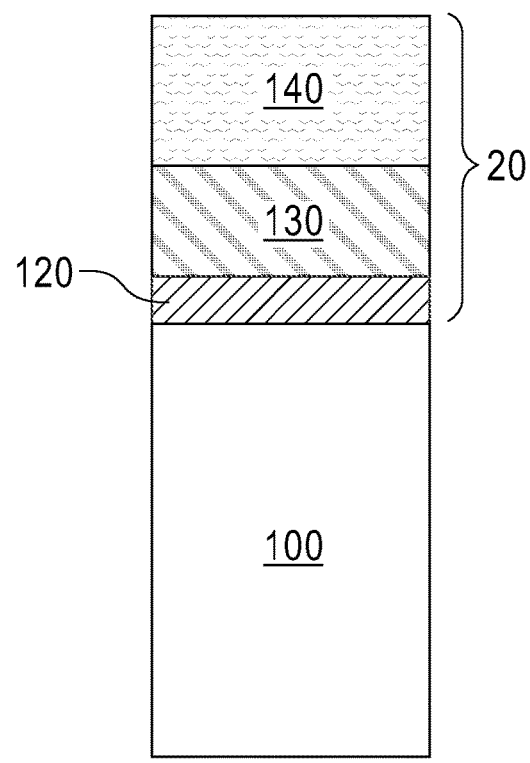
FIG. 2 is a schematic diagram of a composite capping layer according to one embodiment where a manganese-containing layer is disposed over a metal-containing structure, a silicon-containing low-k dielectric layer is disposed over the manganese-containing layer, and an intermediate layer is disposed between the manganese-containing layer and the silicon-containing low-k dielectric layer as a reaction product of the manganese-containing layer and the silicon-containing low-k dielectric layer.

Formation of the interconnect structure 10 is described with reference to FIGS. 1 and 2. FIG. 1 shows an intermediate structure including a copper-containing structure 100, a Mn-containing layer 120 formed over the copper-containing structure 100, and a silicon-containing low-k dielectric layer 140 formed over the Mn-containing layer 120. In embodiments, the Mn-containing layer 120 comprises elemental manganese (Mn), i.e., 100 atomic percent manganese. In other embodiments, the Mn-containing layer comprises manganese nitride (MnN). FIG. 2 shows a composite capping layer 20 integrated into the interconnect structure 10. Composite capping layer 20 includes, from top to bottom, a silicon-containing low-k dielectric layer 140, an intermediate layer 130, and a manganese-containing layer 120. In the illustrated embodiment, the manganese-containing layer is formed directly over the copper-containing structure 100.

Copper-containing structure 100 may be a portion of a metal line or conductive plug, for example, which may be formed using a single or dual damascene process. Copper-containing structure 100 may comprise pure elemental copper (Cu), i.e., 100 atomic percent copper. Pure elemental copper may include incidental oxidation of the copper. However, elemental copper is easily oxidized and diffuses readily into silicon and silicon oxide, adheres poorly to dielectrics such as silicon oxide, and is easily corroded, all of which may adversely affect device reliability.

Thus, in lieu of elemental copper, copper-containing structure 100 may comprise a copper-containing alloy. Copper-containing alloys generally contain at least 40% by weight copper, e.g., 40, 50, 60, 70, 80, 90, 95, 97, 98 or 99% by weight copper, including ranges between any of the foregoing values.

As used throughout the instant application, the term "copper" is intended to include substantially pure elemental copper, copper containing unavoidable impurities including a native oxide, and copper alloys containing one or more additional elements such as carbon, nitrogen, magnesium, aluminum, titanium, vanadium, chromium, manganese, nickel, zinc, germanium, strontium, zirconium, silver, indium, tin, tantalum, and platinum. In embodiments, the copper alloy is a copper-manganese alloy. In further embodiments, in lieu of copper, cobalt metal (Co) or cobalt metal alloys may be used. The copper-containing structures are electrically conductive. "Electrically conductive" as used through the present disclosure refers to a material having a room temperature conductivity of at least $10^{-8}$ $(\Omega\text{-m})^{-1}$.

Deposition techniques such as physical vapor deposition, chemical vapor deposition, atomic layer deposition, or electroless plating can be used to deposit copper-containing structure 100, i.e., copper metallization. Physical vapor deposition (PVD) describes a variety of vacuum deposition methods to form thin layers. PVD uses physical processes such as heating or sputtering to produce a vapor of material, which is then deposited on a substrate. In a chemical vapor deposition (CVD) process, a substrate is exposed to one or more volatile precursors that react and/or decompose on the substrate to produce the desired layer. Electroless copper deposition, for example, can be carried out at relatively low temperatures and can be used to fill trenches, vias or other recesses in dielectrics, and to fabricate in-laid copper structures.

Moreover, it will be appreciated that although the presently-disclosed composite capping layer is an effective barrier layer for copper and copper-containing materials, the composite capping layer may be used in conjunction with other metallization configurations. For instance, the composite capping layer may be used with cobalt-containing or tungsten-containing structures.

The manganese-containing layer 120 may comprise elemental manganese, or a manganese-containing compound such as manganese nitride ($MnN_x$), where $0.1 \leq x \leq 2$. Example of manganese nitride compositions include $Mn_2N$, $Mn_3N$, $Mn_4N$, as well as combinations thereof. The Mn-containing layer may be crystalline or amorphous. The thickness of the Mn-containing layer may be 0.5 to 5 nm, e.g., 0.5, 1, 2 or 5 nm, including ranges between any of the foregoing values.

The manganese-containing layer 120 may be formed using physical vapor deposition, chemical vapor deposition, atomic layer deposition, or evaporation of manganese metal or manganese nitride. By way of example, a manganese nitride layer may be formed by direct deposition of manganese nitride or by deposition of manganese metal followed by nitridation of the manganese metal. Nitridation may be performed using a plasma. Suitable nitridation gases include nitrogen ($N_2$) and ammonia ($HN_3$).

In embodiments, a blanket manganese-containing layer is formed over exposed surfaces of a device structure that includes the copper-containing structure and then removed from surfaces other than the copper-containing structure. In further embodiments, the manganese-containing layer is formed selectively over the copper-containing structure 100, i.e., formed over the copper-containing structure to the exclusion of other surfaces present in the device structure, including pre-existing dielectric layers and liners.

In embodiments, prior to formation of the manganese-containing layer, the copper-containing structure may be provided with a first metal capping layer. The first metal capping layer may comprise a 0.5 to 2 nm thick layer of cobalt (Co) metal, for example.

The manganese-containing layer 120 may function as one or more of an oxygen getter, copper (Cu) and oxygen ($O_2$) diffusion barrier, seed layer and adhesion promoter. For instance, the manganese-containing layer 120 may function as an adhesion promoter between the copper-containing structure 100 and the silicon-containing low-k dielectric layer 140, as well as functioning as a copper and oxygen diffusion barrier.

An oxygen getter is a material that reacts with oxygen to form an oxide. In some embodiments, elemental manganese from the manganese-containing layer 120 may diffuse into contact with oxygen that may be present in or on the copper-containing structure 100 to form a metal oxide layer, e.g., manganese oxide. The metal oxide layer (not shown) may be formed between the copper-containing structure 100 and the manganese-containing layer 120 creating an additional diffusion barrier that obstructs further diffusion of oxygen through the composite capping layer 20.

The silicon-containing low-k dielectric layer 140 is a single layer or multilayer structure that may be porous or non-porous. A silicon-containing low-k dielectric layer may have up to 15% porosity, and may be thermally stable up to at least 350° C. In embodiments, the silicon-containing low-k dielectric layer is amorphous.

Example silicon-containing low-k dielectric materials include amorphous silicon carbonitride (a-SiCN), amorphous oxidized silicon carbon material (a-SiCO), amorphous oxidized silicon carbonitride (a-SiCNO), amorphous silicon oxynitride (a-SiNO), and amorphous silicon oxide, as well as their respective hydrogenated compounds. As used herein, a "low-k" dielectric material has a dielectric constant less than 3.9. In embodiments, the silicon-containing low-k dielectric layer has a dielectric constant of 2.4 to 3.9. For instance, carbon-rich SiCN compositions have a dielectric constant of 3.2 to 4.2, and SiCOH compositions have a dielectric constant of 3 to 3.5. In general, for Si, C, N, O-containing compounds, the dielectric constant increases with increasing nitrogen content.

The silicon-containing low-k dielectric layer may be deposited via plasma enhanced chemical vapor deposition (PECVD). In a PECVD process, process variables that may be controlled during deposition of the silicon-containing low-k dielectric layer include RF power, precursor mixture and flow rate, reactor pressure and substrate temperature. An example deposition process includes trimethylsilane (TMS) or dimethylsilacyclopentane (DMSCP) in conjunction with ammonia ($NH_3$) or nitrogen ($N_2$) as gas reactants. Optionally, ethylene ($C_2H_4$) or other hydrocarbon precursors may be used to increase the carbon content and/or porosity of the low-k dielectric layer. Also, oxygen ($O_2$) may be added to the feed gas. An inert gas such as argon or helium may be used as a carrier gas. Liquid precursors may be transported to the plasma reactor using a liquid delivery system. The deposition temperature may range from 100° C. to 400° C., e.g., 250° C. to 400° C. using 13.56 MHz RF power.

The composition of the silicon-containing low-k dielectric layer 140 may be constant or variable, i.e., constant or variable as a function of layer thickness. In embodiments, the content of one or more of carbon, nitrogen and oxygen within the silicon-containing low-k dielectric layer 140 may or may not be graded over the thickness of the layer. The total thickness of the silicon-containing low-k dielectric layer 140 may be 2 to 40 nm, e.g., 2, 5, 8, 10, 20 or 40 nm, including ranges between any of the foregoing values.

If desired, the silicon-containing low-k dielectric layer may be stabilized before undergoing further integration processing. A stabilization process may be performed in a furnace annealing step under a flowing inert gas (e.g., $N_2$ or Ar) at a temperature of 300° C. to 400° C. for a time of 0.5 to 2 hr. The stabilization process can also be performed using a rapid thermal annealing (RTA) at temperatures in excess of 300° C.

Either during formation of the silicon-containing low-k dielectric layer 140 over the manganese-containing layer 120, or after its formation during a post-deposition anneal, manganese reacts with oxygen and with the silicon-containing low-k dielectric layer to form an intermediate layer 130 at the interface between the silicon-containing low-k dielectric layer 140 and the manganese-containing layer 120. For example SiCN, oxygen and manganese may react to form SiCNMnO, while SiCO, oxygen and manganese may react to form SiCMnO. As will be appreciated, the intermediate layer may comprise additional compounds depending on the respective compositions of the reactant layers. For instance, the intermediate layer may include SiMnO. As a consequence of the interfacial reaction, the thickness of each of the manganese-containing layer 120 and the silicon-containing low-k dielectric layer 140 decrease as these layers are partially consumed to form the intermediate layer 130. In embodiments, the intermediate layer 130 has a dielectric constant of 2.4 to 3.9. In embodiments, the dielectric constant of the intermediate layer 130 may range from 2.4 to 5, e.g., 2.4, 2.6, 2.8, 3, 3.2, 3.4, 3.6, 3.8, 4, 4.2, 4.4, 4.6, 4.8 or 5, including ranges between any of the foregoing values.

Figure 4:
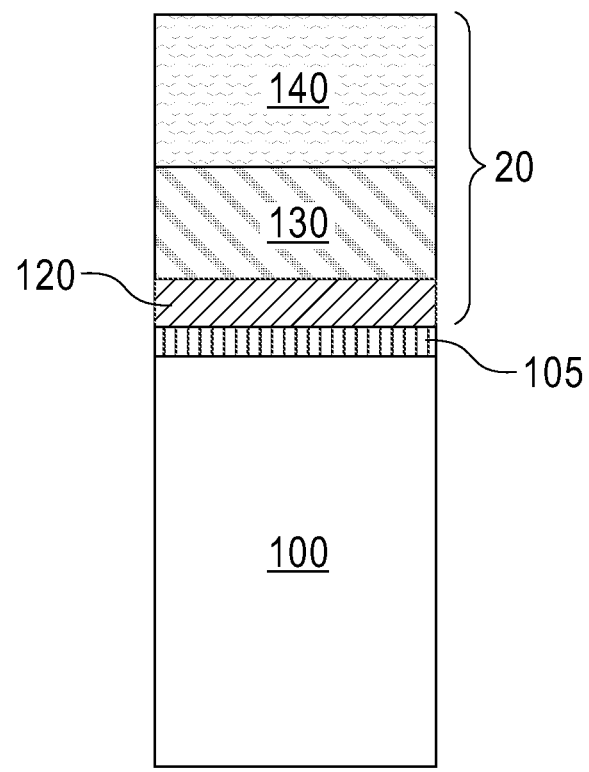
FIG. 4 is another schematic diagram of a composite capping layer according to one embodiment where a metal capping layer and a manganese-containing layer are disposed over a metal-containing structure, a silicon-containing low-k dielectric layer is disposed over the manganese-containing layer, and an intermediate layer is disposed between the manganese-containing layer and the silicon-containing low-k dielectric layer as a reaction product of the manganese-containing layer and the silicon-containing low-k dielectric layer.

FIG. 2 depicts one embodiment of an interconnect structure 10 that includes a composite capping layer 20 disposed over a copper-containing structure 100. The composite capping layer 20 comprises, from top to bottom, a silicon-containing low-k dielectric layer 140, intermediate layer 130, and a manganese-containing layer 120. The intermediate layer is formed in situ as the reaction product of the adjacent layers. The composite capping layer 20 may function as at least one of a diffusion barrier for obstructing copper from diffusing out of the copper-containing structure 100 and a diffusion barrier for obstructing oxygen from diffusing into the copper-containing structure. In the illustrated embodiment, the manganese-containing layer is formed directly over the copper-containing structure. In further embodiments and as shown in FIG. 4, the interconnect structure 10 may include an intervening layer 105 such as a thin layer of cobalt between the manganese-containing layer 120 and the copper-containing structure 100. The intervening layer 105 thickness may range from 2 to 10 nm.

In embodiments, the composite capping layer has a total thickness of less than 30 nm, e.g., less than 30, 20 or 10 nm, and a dielectric constant of less than 5.

The interconnect structures disclosed herein may be incorporated into any electrical device. For example, the interconnect structures may be present within electrical devices that use semiconductors that are present within integrated circuit chips. The integrated circuit chips including the disclosed interconnects may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processing unit.

Figure 3:
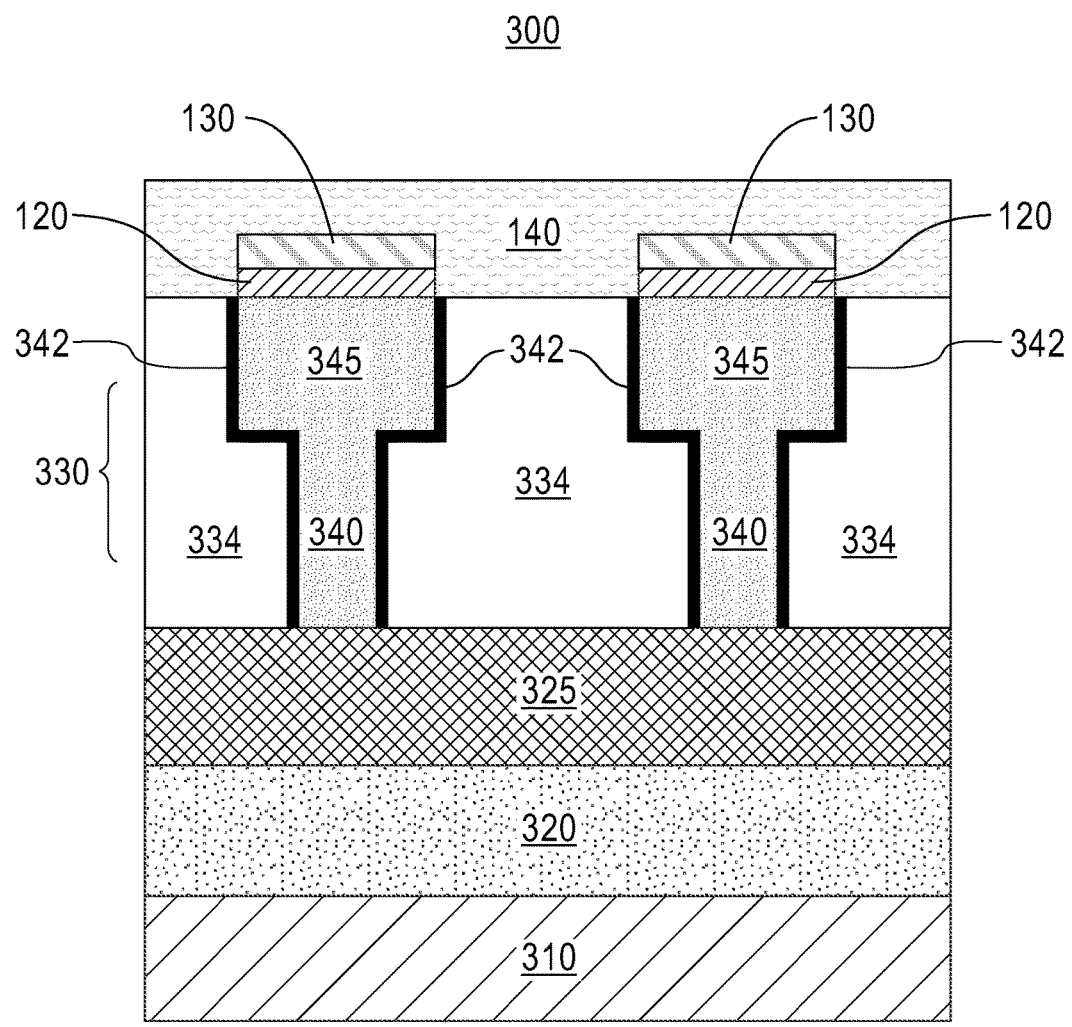
FIG. 3 is a cross-sectional view of an example interconnect structure that includes a composite capping layer.

FIG. 3 shows a cross-sectional schematic of an interconnect structure 300 on a semiconductor chip having a substrate 310, device level 320, and wiring levels 325 and 330. Substrate 310 may be a bulk semiconductor substrate such as silicon, or a silicon-on-insulator (SOI) substrate. Device level 320 may include, for example, p-type and n-type field effect transistors (FETs), p-type and n-type bipolar transistors, or other transistors or memory structures formed in a semiconductor layer. The devices may be interconnected to form complimentary metal oxide silicon (CMOS) logic, bipolar CMOS (BiCMOS), FETs and bipolar circuitry. Other types of integrated circuit devices or structures may be included within device level 320. Wiring levels may be interconnected to each other by means of vias 340. The wiring levels may be comprised of a copper line and an intralevel dielectric between wires in each wiring line.

Wiring level 330 includes a dielectric layer 334, vias 340, and conductive lines 345. Vias 340 and conductive lines 345 are composed of copper and may be formed by a single or dual damascene process. Vias 340 are encased by metal liners 342, which provide a diffusion barrier to the copper in the respective via and conductive line. Metal liners 342 may also promote adhesion between the copper and the dielectric layer 334. Example metal liners 342 include tantalum (Ta) and tantalum nitride (TaN).

A manganese-containing layer 120 is selectively deposited over the conductive lines 345, and a silicon-containing low-k dielectric layer 140 is deposited over the manganese-containing layer 120. During and/or subsequent to the deposition of the low-k dielectric layer 140, intermediate layer 130 is formed in situ via reaction between the low-k dielectric layer and the manganese-containing layer.

Disclosed is a composite capping layer for copper-containing metallization that is formed at least partially in situ and includes the reaction product of Mn (or MnN) with a silicon-containing low-k dielectric such as SiCN. The composite capping layer is an effective etch stop and diffusion barrier that enables thinner overall architectures for advanced node designs, particularly in back end of line (BEOL) fabrication for logic and memory devices. In particular, the presently-described capping layer is an effective diffusion barrier to both copper and oxygen.

As used herein, the singular forms "a," "an" and "the" include plural referents unless the context clearly dictates otherwise. Thus, for example, reference to a "nitride"

includes examples having two or more such "nitrides" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region, or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a silicon-containing low-k dielectric layer that comprises SiCN include embodiments where a silicon-containing low-k dielectric layer consists essentially of SiCN and embodiments where a silicon-containing low-k dielectric layer consists of SiCN.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed as new is:

1. A method of forming a composite capping layer over a metal-containing structure, the method comprising:
    forming a manganese-containing layer over a metal-containing structure, wherein the metal-containing structure has a topmost surface that is located entirely beneath a bottommost surface of the manganese-containing layer;
    forming a silicon-containing low-k dielectric layer over the manganese-containing layer; and
    reacting the manganese-containing layer and the silicon-containing low-k dielectric layer to form an intermediate layer between the manganese-containing layer and the silicon-containing low-k dielectric layer.

2. The method of claim 1, wherein the metal-containing structure comprises elemental copper, elemental cobalt, a copper alloy or a cobalt alloy.

3. The method of claim 1, wherein the manganese-containing layer is formed selectively over the metal-containing structure.

4. The method of claim 1, wherein the manganese-containing layer is formed directly over the metal-containing structure.

5. The method of claim 1, wherein prior to forming the manganese-containing layer, a metal capping layer is formed on a surface of the metal-containing structure.

6. The method of claim 1, further comprising annealing the silicon-containing low-k dielectric layer at a temperature of 300° C. to 400° C.

7. The method of claim 1, wherein the metal-containing structure is a metal line or conductive plug.

8. The method of claim 1, wherein the manganese-containing layer comprises elemental magnesium or magnesium nitride having the formula $MnN_x$, wherein $0.1 \leq x \leq 2$.

9. The method of claim 1, wherein the manganese-containing layer is crystalline.

10. The method of claim 1, wherein the magnesium-containing layer is amorphous.

11. The method of claim 1, wherein the forming the manganese-containing layer comprises:
    depositing a magnesium metal; and
    nitridizing the magnesium metal.

12. The method of claim 1, wherein the silicon-containing low-k dielectric layer has a porosity up to 15%.

13. The method of claim 1, wherein the silicon-containing low-k dielectric layer is amorphous.

14. The method of claim 1, wherein the silicon-containing low-k dielectric layer is selected from the group consisting of amorphous silicon carbonitride (a-SiCN), amorphous oxidized silicon carbon material (a-SiCO), amorphous oxidized silicon carbonitride (a-SiCNO), amorphous silicon oxynitride (a-SiNO), and amorphous silicon oxide, and their respective hydrogenated compounds.

15. The method of claim 1, wherein the reacting the manganese-containing layer and the silicon-containing low-k dielectric layer occurs during the formation of the silicon-containing low-k dielectric layer.

16. The method of claim 1, wherein the reacting the manganese-containing layer and the silicon-containing low-k dielectric layer occurs during an annealing process that follows the formation of the silicon-containing low-k dielectric layer.

17. The method of claim 1, wherein the intermediate layer comprises SiCNMnO or SiMnO.

18. The method of claim 1, wherein the manganese-containing layer has an initial thickness and the silicon-containing low-k dielectric layer has an initial thickness, and wherein after the reacting the initial thickness of both the manganese-containing layer and the silicon-containing low-k dielectric layer is reduced.

19. The method of claim 1, wherein the intermediate layer has a dielectric constant of 2.4 to 3.0.

20. A method of forming a composite capping layer over a metal-containing structure, the method comprising:
    forming a manganese-containing layer over a metal-containing structure;
    forming a silicon-containing low-k dielectric layer over the manganese-containing layer; and
    reacting the manganese-containing layer and the silicon-containing low-k dielectric layer to form an intermediate layer between the manganese-containing layer and the silicon-containing low-k dielectric layer, wherein the metal-containing structure is embedded in a dielectric material and has a topmost surface that is coplanar with a topmost surface of the dielectric material, and wherein the magnesium-containing layer, the silicon-containing low-k dielectric layer, and the intermediate layer are located above the topmost surface of the dielectric material, and further wherein the silicon-containing low-k dielectric layer is located on sidewall surfaces of the intermediate layer and the magnesium-containing layer and on a topmost surface of the intermediate layer.

\* \* \* \* \*